United States Patent [19]  
Audykowski et al.

[11] Patent Number: 4,544,623
[45] Date of Patent: Oct. 1, 1985

[54] PHOTOSENSITIVE COATING COMPOSITION AND THE USE THEREOF FOR PROTECTIVE PURPOSES

[75] Inventors: Thaddeus Audykowski, Allschwil; Anton Mentha, Endingen; Ewald Losert, Rheinfelden, all of Switzerland

[73] Assignee: Ciba-Geigy Corporation, Ardsley, N.Y.

[21] Appl. No.: 573,098

[22] Filed: Jan. 23, 1984

Related U.S. Application Data

[63] Continuation-in-part of Ser. No. 415,493, Sep. 7, 1982, abandoned.

[30] Foreign Application Priority Data

Sep. 17, 1981 [CH] Switzerland .................. 6007/81

[51] Int. Cl.$^4$ .................. G03C 1/68; G03C 5/16
[52] U.S. Cl. .................. 430/280; 430/273; 430/311; 430/935; 430/325; 430/330; 204/159.14

[58] Field of Search .............. 430/315, 935, 280, 325, 430/330, 961, 270, 273, 311; 427/385.5, 386, 96; 204/159.14

[56] References Cited

U.S. PATENT DOCUMENTS 3,721,617 3/1973 Watt .................. 430/280 X
4,074,008 2/1978 Green .................. 428/418
4,230,793 10/1980 Losert et al. .................. 430/935 X
4,237,216 12/1980 Skarvinko .................. 430/280
4,479,990 10/1984 Dixon et al. .................. 204/159.14 X

FOREIGN PATENT DOCUMENTS 2445624 2/1981 France .
2032939 5/1980 United Kingdom .................. 430/280

Primary Examiner—John E. Kittle
Assistant Examiner—Cynthia Hamilton
Attorney, Agent, or Firm—Luther A. R. Hall

[57] ABSTRACT

Uniform protective coatings, particularly solder resist masks, on printed circuit boards can be produced with coating compositions having a viscosity of 200 to 700 m Pas at 25° C. and comprising a solution of a photosensitive, thermally curable, lacquer-forming substance, wherein there is additionally uniformly dispersed 5 to 50% by weight of a finely divided filler.

16 Claims, No Drawings

PHOTOSENSITIVE COATING COMPOSITION AND THE USE THEREOF FOR PROTECTIVE PURPOSES

The present invention relates to a composition of a dissolved, photosensitive, thermally curable substance containing a finely divided filler, and to the use thereof for producing protective coatings, preferably by a curtain coating process.

In the manufacture of printed circuits, it is customary to provide the conductor lines with a thin insulating and protective layer to protect them against external influences. These layers often serve simultaneously as solder resist masks, in order to prevent an undesirable contact of the conductor lines in subsequent soldering operations. The curtain coating method in particular has proved satisfactory as a means of applying the thin layers. This method is described for example in the U.S. Pat. No. 4,230,793.

Great demands are made on the photosensitive lacquers: they have to exhibit a high resolution and a high development capacity, and have good adhesion on the conducting metal and on synthetic resins, and possess a high thermal, mechanical, electrical, chemical and/or flame resistance. For such properties to be obtained, it is necessary to achieve a largely uniform thickness of the protective layer, which has to be free from pores and blisters. The attainment of uniform layer thicknesses whilst retaining the desired properties has proved in practice, using the curtain coating method, to be a problem which hitherto has been only partially solved. For example, when the lacquer has too high a viscosity and hence too low a flowability, the wetting between the conductor lines, especially in the case of small spacings (fine conductor technique) is inadequate or even interrupted and therefore such conductors are not properly isolated in these areas. On the other hand, it is observed when the viscosity of the lacquer is not high enough that the covering at the edges of the conductor lines is too thin, and this is a result of the layer flowing after application (thinning effect at the edges). The protective function of the layer is consequently impaired.

Furthermore, it has been shown in practice that for example the solder resist lacquers do not fully satisfy requirements in the soldering operation, wherein a protective mask has to withstand, without suffering damage, temperatures for example of 270° C. for 10 seconds. Where corrosive fluxes are employed, the reject rates are additionally increased. This is a considerable economical disadvantage because such defective parts do not occur until towards the end of production. A further problem not hitherto satisfactorily solved is the insufficient adhesion of such coating compositions on lead/tin alloys.

It was found that, surprisingly, coatings of very good quality can be achieved, in spite of applying them at relatively low viscosity, by using a certain amount of finely divided fillers. The respective coating compositions even over prolonged periods of time do not cause plugging of plated through-holes on printed circuit boards. The highly improved coating quality of such compositions results particularly in increased edge covering on conductor lines, improved temperature resistance, chemical resistance, electrical insulation and adhesion on lead/tin alloys.

From the British published application No. 2,032,939 are known photosensitive coating compositions which contain finely divided fillers and, as photosensitive substances, reaction products of polyepoxides with ethylenically unsaturated carboxylic acids. These coating compositions are mainly used as screen printing inks having a relatively high viscosity. Their use in the coating process is also generically mentioned without, however, any details whatsoever about the problems involved as mentioned above, such as coating uniformity, edge covering, no plugging of plated through-holes etc. The photosensitive substance is a thermoplast. It was found, however, that these coating compositions, when used in the curtain coating process, do not yield coatings which fulfill all the practical requirements. These known coating compositions further do not satisfy present-day requirements with regard to flame-resistance such as defined by the UL-94 classification.

It is therefore the object of the present invention to provide a photosensitive coating composition which, especially when applied by the curtain coating method, will give on printed circuit boards a uniform coating with good edge covering even at low viscosities, which has improved adhesion on lead/tin alloys, and which furthermore exhibits an improved stability during the soldering operation, also when corrosive fluxed are used, so that consequently the reject rates are reduced. Such coating compositions should also not cause plugging of the plated through-holes on printed circuit boards.

Hence, the present invention relates to a coating composition especially suitable for curtain coating, having a viscosity of 200 to 700 m Pas at 25° C. and comprising a solution of a photosensitive, lacquer-forming substance, characterised in that there are uniformly dispersed in the solution from 5 to 50% by weight, relative to the photosensitive substance, of a finely divided filler, and that the photosensitive substance is additionally thermally curable.

Suitable photosensitive, thermosetting, lacquer-forming substances are familiar to the expert. The substances preferred are those which are cured by polyaddition. They can be monomers or prepolymers. A preferred class comprises photosensitive epoxide resins having free curable epoxide groups, which are used together with a customary curing agent and, optionally, a curing accelerator. The photosensitive group is preferably an ethylenically unsaturated group, which can be bound for example as a side-chain group, for example a cinnamic acid group, or in a molecule chain, for example the chalcone group. The epoxide resins can be monomers, or preferably pre-reacted adducts with customary curing agents, such as polyamines, polycarboxylic acids, polyalcohols and polyphenols. Preferred curing agents are dicyandiamide and derivatives thereof such as o-tolylbiguanide and xylylbiguanides, especially 2,6-xylylbiguanide. Suitable accelerators are, e.g., imidazoles, trietylamine and various substituted urea compounds such as monurone [N-(4-chlorophenyl)N',N'-dimethylurea], diurone [N-(3,4-dichlorophenyl)N',N'-dimethylurea, nonurone [N-phenyl-N',N'-dimethylurea], chlorotolurone [N-(3-chloro-4-methylphenyl)N',N'-dimethylurea] and Mannich bases. Chlorotolurone is the preferred accelerator. The epoxide resins on which the substances are based can be built up starting with bisphenols, such as bisphenol A [2,2-bis(4-hydroxyphenyl)-propane], novolacs, hydantoins, uracils and isocyanurates.

Preferred epoxide resins are those having chalcone groups and free curable epoxide groups as photosensitive and thermosetting substances. Compounds containing chalcone groups, which are suitable for building up such epoxide resins are for example: 4,4'-dihydroxydistyryl ketone, bis-(p-hydroxy-benzoylvinyl)-phenylene or p-hydroxyphenyl-p-hydroxystyryl ketone. Photosensitive thermosetting substances suitable for the coating composition according to the invention are described for example in the German Offenlegungsschrift No. 2,342,407.

The coating compositions according to the invention can be, depending on the type of photopolymerisable substance used, aqueous solutions optionally rendered alkaline or acidic, or organic solutions. Suitable organic solvents, which can be used on their own or in mixtures, are for example: ketones, such as dimethyl ketone, diethyl ketone, methylisobutyl ketone, cyclohexanone, cyclopentanone, cycloheptanone, isophorone, methoxyhexanone, acetonylacetone, acetophenone, benzylethyl ketone, 3,3,5-trimethylcyclohexanone or mesityl oxide; halogenated hydrocarbons, such as carbon tetrachloride, chloroform, methylene chloride, methylene bromide, bromochloromethane, 1,2-dichlorethane, 1,1,2-trichloroetane, 1,1,2,2-tetrachloroethane, 1,2,3-trichloropropane or perchloroethylene; alcohols, such as methanol, ethanol, propanol, butanol, hexanol, cyclohexanol, furfuryl alcohol, tetrahydrofurfuryl alcohol, benzyl alcohol, monoalkylated glycols, such as methyl glycol, ethyl glycol, isopropyl glycol, ethyl diglycol, triethylene glycol, monoethyl- or -monobutyl ether, propyleneglycol monomethyl ether, glycols, such as ethylene, propylene or butylene glycol, and oligomers thereof, such as triethylene glycol; aliphatic and aromatic hydrocarbons, such as pentane, hexane, cyclohexane, methylcyclohexane, benzene, toluene or xylene; ethers, such as diethyl ether, dibutyl ether, tetrahydrofuran, dioxane, ethylene glycol dimethyl ether, diethylene glycol dimethyl ether; carboxylic acids esters, such as methyl, ethyl, propyl, butyl and isopropyl acetate as well as phenyl acetate, propionic acid methyl ester, glycolic acid butyl ester, benzoic acid methyl ester, ethyl glycol mono- or diacetate, or methyl- or ethylglycolic acid acetate; lactones, such as butyro- or valerolactone; acid amides, such as dimethylformamide, dimethylacetamide or hexamethylphosphoric acid triamide; and sulfones, for example dimethylsulfone, dibutylsulfone or tetramethylenesulfone. The coating composition according to the invention preferably contains a solvent.

Preferred solvents are alcohols, especially tetrahydrofurfuryl alcohol; cyclic ketones such as cyclopentanone and more particularly cyclohexanone; monoalkylated glycols such as methyl glycol and propyleneglycol monomethyl ether, ethers such ethylene glycol dimethyl ether and more particularly diethylene glycol dimethyl ether; carboxylic acid esters such as ethyl glycol mono-and diacetate and glycolic acid n-butyl ester, as well as mixtures of such solvents.

The amount of solvent used depends mainly on the desired viscosity of the coating composition, which is preferably between 200 and 500, particularly between 300 and 450 m Pas.

Similarly, the amount of filler depends on the desired properties to be achieved and on the nature of the filler used. Matting effects may be attained with filler concentrations as low as 5% by weight. The amount of filler is perferably at least 10% by weight, particularly from 10 to 36% by weight and most preferably from 15 to 30% by weight. Furthermore, the filler can have a specific surface area of at least 10 $m^2/g$, especially at least 100 $m^2/g$. Depending on the filler, the specific surface area can be up to 500 $m^2/g$ and more.

The particle size of the filler has to be made smaller than the distance between the lines of conductors on printed circuit boards. The mean particle size can be from 0.01 to 10 $\mu$m, preferably from 0.01 to 5 $\mu$m. Particularly preferred are micronised fillers which have in general a particle size of from 0.01 to 1.5 $\mu$m.

Suitable fillers are for example finely divided silicon dioxide which may be colloidal or rendered hydrophobic, micronised talcum, micronised mica, kaolin, aluminium oxide, aluminium hydroxide, calcium silicate, aluminium silicate, magnesium carbonate, calcium carbonate, zirconium silicate, porcelain powder, glass powder, antimony trioxide, titanium dioxide, barium titanate and barium sulfate or mixtures thereof.

Organic fillers such as polyethylene, chlorinated polyethylene, polypropylene, poly-trifluorochloroethylene, poly-tetrafluoroethylene, polyether sulfone, polyvinyl chloride, polyurethanes, polystyrene, polyacrylates, melamine and urea formaldehyde resins, epoxide resins and silicones can be used in admixture with the above-mentioned inorganic fillers, preferably in an amount of up to 50% by weight.

Particularly preferred fillers are finely divided silicon dioxide, talcum, especially micronised talcum, aluminium oxide, antimony oxide and kaolin or mixtures thereof. The fillers are advantageously provided with an adhesion promoter, in order to obtain a strong adhesion between the polymer matrix and the filler. Customary adhesion promoters are for example: trialkoxysilanes having functional groups, for example OH, $NH_2$ and epoxide or vinyl groups. Examples are: trialkoxysilyl-$\gamma$-glycidyloxy- or -$\gamma$-aminopropane and trialkoxyvinyl- or -allyl-silanes. The alkoxy group can contain 1 to 12 C atoms, and can be for example: methyl, ethyl, propyl, butyl, hexyl, octyl or dodecyl.

The coating composition according to the invention contains particularly advantageously at least 10% by weight of micronised talcum, either on its own or in combination with other fillers, at least half of the total amount of filler being however micronised talcum. It has been found that the adhesion of the layer on the printed circuits and on a lead/tin alloy is especially improved as a result.

The coating composition can contain further customary additives, for example: levelling agents, dyes, pigments, stabilisers, fireproofing agents such as decabromodiphenyl oxide, photosensitisers and photoactivators, curing agents and curing accelerators. The addition of 1 to 5% by weight of polyethylene, relative to the amount of photopolymerisable substance has proved to be advantageous. It has been found that, consequently, blistering, particularly along the conductors lines, and around plated through-holes is completely prevented.

Particularly advantageous is the addition of anti-settling agents for increasing the storage stability of the coating compositions according to the invention, and for maintaining good processing characteristics. A precipitation of the filler is thus avoided, and hence the necessity of again effecting a uniform dispersion before further processing. The anti-settling agent can be added in amounts of 0.1-3% by weight, relative to the amount of filler. Examples of agents of this type are montmorillonite, bentone, asbestos and xonolite.

The coating composition according to the invention can be produced by a premixing of the individual constituents and the subsequent combining thereof, or by mixing together of the individual components in devices normally used for the purpose, such as stirrer vessels, which ensure a uniform mixing. It has proved advantageous to firstly disperse the fillers in a suitable medium, for example in polyester resins containing hydroxyl groups and/or in solvents, and to thus process them, optionally with the addition of an adhesion promoter, into pastes, by which a dispersion time that is too long and, under certain circumstances, harmful for the photosensitive substances is avoided. Pastes of this kind can be prepared, e.g. in ball mills, high-speed dissolvers or roller mills.

The coating compositions according to the invention are excellently suitable for producing insulating and protective coatings, and particularly for producing solder resist masks and galvanoresists on printed circuits. Pore-free and blister-free, uniform coatings having good adhesion, even with minute conductor spacings ($<200$ $\mu$m), are obtained. The thinning at the edges is reduced: the layer-thickness over the edges can be 50% and more of the total layer thickness, this being in general within the range of 5 to 50 $\mu$m, especially 10 to 30 $\mu$m. There is found an improved adhesiveness on metals, such as lead/tin and tin, before and after soldering, and the fillers produce a silky to mat surface, as a result of which the visual quality control is rendered easier.

The coating compositions according to the invention can be processed by the customary methods, for example by brushing, spraying, rolling and dipping. The curtain coating method, which is described in the U.S. Pat. No. 4,230,793, is particularly suitable.

The invention therefore also relates to a process for producing protective masks by applying a thin layer of a coating composition according to the invention to a printed circuit board by the curtain coating method, subsequently drying and irradiating the layer imagewise while the soldered junctions are being left blank, developing the non-irradiated areas of the layer with a solvent and then curing.

A specific embodiment is described below:

After application of the layer to a substrate, especially a printed circuit, the solvent can be removed by heating in ovens (for example tunnel ovens or air conversion stationary ovens) in order to obtain tack-free layers for further processing. The coated substrate is thereupon irradiated (UV rays), optionally through a picture mask, and is afterwards developed with a solvent for the purpose of freeing the metallic parts of soldered junctions from the polymer. The application of the filler-containing coating composition is effected without plated through-holes that are present becoming plugged, so that polymer residues on development are completely removed. The films can then be cured at higher temperatures of for example 80° to 160° C. The printed circuits thus obtained have protective layers which satisfy the demands made on them. The electrical properties are not impaired, and the stability in the soldering bath is considerably improved, so that even several cycles in the soldering bath are possible.

During the soldering process used in the manufacture of electronic components various conditions must be met. Besides the temperature of the soldering bath, the time of immersion and the composition of the flux material used are of great importance. A suitable arrangement for testing coating compositions in the manufacture of printed circuits is as follows: The flux used in testing the coating compositions is based on a mixture of rosin and adipic acid, having an acid number of 225. This is a very corrosive medium. Test panels of printed circuits are immersed in the flux during 5 seconds and dried off during 60 seconds at room temperature. Thereafter, the panels are immersed vertically in the solder bath at a temperature of 260°–270° C. during 10 seconds. After washing off flux residues with isopropanol, the printed circuits are inspected under a microscope. No blistering, shrivelling, cracking or peeling off of the solder mask coating should be tolerated. This test should be carried out up to three times with the same good results in order to establish a satisfactory performance of the coating composition used.

The preferred curtain coating process, which is suitable in particular for coating compositions containing photopolymerisable and thermally curable epoxide resins, can be performed as follows: A thin liquid curtain of the coating composition is produced at room temperature by the material being squeezed out of a slit, the viscosity of the coating composition preferably being between 200 and 500 m Pas. The flow rate of the curtain is so adjusted that when the material comes into contact with the printed circuit board the rate of flow is 60–160, particularly 70–120 m/min. The board to be coated is advantageously preheated, for example to 60°–100° C., depending on the layer thickness of the coating to be applied. The board is passed through the flowing curtain at a rate which is about equal to, and preferably greater than, the flow rate of the curtain. The remaining curtain coating application characteristics for obtaining good quality films are, e.g., as follows:

pretreatment/cleaning: brush cleaning with pumice;
slit opening: 0.5 mm;
height of the coating curtain: 11 cm;
temperature of the lacquer: 24° C.;
viscosity of the lacquer at 24° C.: DIN Cup No. 4, 63 seconds;
applied weight of the wet coating/600 cm$^2$: 6–8 g;
speed of the board passage: 90 m/min;
flash-off time: 15 min;
drying conditions: 10 min at 80° C. and 30 min at 80° C. (both sides);
cooling-off time: 15 min;
UV exposure under BASF lamp 2×5000 watt: 2 min;
waiting time before development process: 30 min;
development process in a mixture of $\gamma$-butyrolactone, propylene carbonate and n-butyldiglycol (20:50:30): at 34°–38° C., speed 0.8 m/min, time 2 min;
curing conditions: 1 hour at 80° C. and 1 hour at 135° C.

The examples which follow further illustrate the invention. The term 'parts' denotes parts by weight.

EXAMPLE 1

4000 parts of an approximately 50% by weight solution in a mixture of 33 parts of methyl glycol and 88 parts of ethyl glycol monoacetate, of a photosensitive epoxide resin obtained from bis-1,3(4-glycidyloxybenzal)acetone [diglycidylether of 4,4'-dihydroxydistyryl ketone], 2,2-bis(4-hydroxyphenyl)propane [bisphenol A] and 2,2-bis(3,5-dibromo-4-hydroxyphenyl)propane [tetrabromo-bisphenol-A], having a molecular weight of 3000–3500 and an epoxide content of 0.8–1.0 equivalent/kg, are diluted with 800 parts of a 1:1 mixture of cyclohexanone/methyl glycol; and 1792 parts of paste containing micronised talcum are added portionwise; the mixture is then stirred for 10 minutes, and 645 parts of a curing agent based on dicyandiamide and chlorotolurone are added as an accelerator (9.5% solution in methyl glycol). The coating composition has a viscosity of 435 m Pas at 24° C., and a solids content of 35% by weight. The content of talcum per solid of the lacquer is 21%. By coating using the curtain coating method, there is obtained a defect-free, uniform coating of printed circuits, and a very good edge covering of the conductor lines (cp. Table 1).

The micronised talcum paste is prepared as follows:

250 parts of cyclohexanone, 240 parts of methyl glycol, 6 parts of γ-glycidyloxypropyl-trimethoxysilane (SILAN-A 187) and 4 parts of deionised water are mixed in a closed vessel shielded from light rays with UV filters; 330 parts of micronised talcum (mean particle size 1.5 μm) and 5 parts of bentone 27 are then stirred in portionwise. Finally, 165 parts of the photosensitive epoxide resin solution mentioned at the beginning are stirred in, and this suspension is dispersed, during about 10 hours, by means of a Dyno mill having 12.5 liters of glass balls of 1.0-1.5 mm diameter, the suspension in the process passing, by means of a recirculating pump, several times through the grinding apparatus. In the course of this circulation grinding, the temperature of the mixture does not exceed 85° C., this being regulated by a cooling system connected to the Dyno Mill.

EXAMPLE 2

1500 parts of the epoxide resin solution according to Example 1 are diluted with 400 parts of a 1:1 mixture of cyclohexanone/methyl glycol; and 484 parts of paste containing silicon dioxide are then added portionwise. The mixture is stirred for 10 minutes, and there are subsequently added 180 parts of a curing agent based on 2,6-xylylbiguanide (11% solution in methyl glycol). The coating composition has a viscosity of 380 m Pas at 24° C., and a solids content of 40% by weight. On applying the coating by the curtain coating method, there is obtained a defect-free uniform, flame-resistant coating of a printed circuit with a good edge covering of the conductor lines and no plugging of the plated throughholes.

The paste containing silicon dioxide is obtained as follows:

5634 parts of cyclohexanone are mixed together with 33 parts of γ-glycidyloxypropyltrimethoxysilane and 1750 parts of a 20% polyethylene dispersion in n-butyl alcohol. Into this mixture are then stirred, at a temperature of 130° C., 840 parts of silicon dioxide having a mean particle size of 3-4 μm, 30 parts of bentone and 33 parts of deionised water, until a good fluid consistency is obtained. The mixture is cooled to 30° C.; 1680 parts of the epoxide resin solution are stirred in, and the mixture is subsequently ground in a Koruma mill.

EXAMPLE 3

234 parts of methyl glycol, 78 parts of a polyester resin containing hydroxyl groups (Vesturit BL 914) and 3.8 parts of γ-aminopropyltrimethoxysilane are stirred in a high speed dissolver; 188 parts of talcum having a mean particle size of 2-3 μm are added, and dispersed for 10 minutes. The talcum paste is allowed to stand for 24 hours before use.

1284 parts of the epoxide resin solution according to Example 1 are diluted with 276 parts of methyl glycol; 435 parts of the talcum paste are then added portionwise with stirring; after 10 minutes of further stirring, 154 parts of 2,6-xylylbiguanide solution (11% in methyl glycol) are added, and the mixture is subsequently diluted with 100 parts of methyl glycol. The coating compound has a viscosity of 380 m Pas at 24° C., and a solids content of 39.5%. On application of a solder resist mask by the curtain coating process, a uniform coating free from defects and having good edge covering is obtained.

EXAMPLE 4

3000 parts of epoxide resin solution according to Example 1 are diluted with 1000 parts of cyclohexanone; and, with stirring, 1125 parts of a 33% aluminium oxide paste (mean particle size 0.02 μm), in a 1:1 mixture of methyl glycol/cyclohexanone, are added portionwise; and 360 parts of a 2,6-xylylbiguanide solution (11% solution in methyl glycol) are mixed in. The viscosity of the coating composition is 280 m Pas at 25.7° C., and the solids content is 34.8%. The filler content is 24% by weight, relative to the binder. Printed circuits coated by the curtain coating method are free from defects and display good edge covering.

EXAMPLE 5

2000 parts of the epoxide resin solution according to Example 1 are diluted with 850 parts of a 1:1 mixture of methyl glycol/cyclohexanone; and 850 parts of a 33% antimony oxide paste (mean particle size <1 μm), in a 1:1 mixture of methyl glycol/cyclohexanone, are then added portionwise. After 10 minutes' stirring, there are also stirred in and dispersed 240 parts of 2,6-xylylbiguanide solution (11% solution in methyl glycol). The coating compostion obtained has a viscosity of 245 m Pas at 24.5° C., and a solids content of 33% by weight. On application of solder resist masks, uniform coatings free from defects and having good edge covering are obtained.

EXAMPLE 6

From 234 parts of methyl glycol, 78 parts of a polyester resin containing hydroxyl groups (Vesturit BL 914), 3.8 parts of γ-amino-propyltriethoxysilane, 180 parts of calcined kaolin (mean particle size 3 μm) and 25 parts of silicon dioxide (Syloid 161), there is produced a paste by means of dispersion for 10 minutes in an high speed dissolver. The paste is left to stand for 24 hours before use. 1284 parts of the epoxide resin solution according to Example 1 are diluted with 275 parts of methyl glycol. There are then added portionwise, with stirring, 435 parts of the kaolin paste; stirring is continued for 10 minutes, and 163 parts of 2,6-xylylbiguanide solution (11% solution in methyl glycol) are also added and dispersed. The resulting coating composition has a viscosity of 350 m Pas at 25° C., and a solids content of 41.8% by weight. In the curtain coating process, the coating composition yields uniformly coated printed circuits which are free from defects and have good edge covering.

The coatings are effected on a Bürkle-Probimer-150 machine under the following conditions: pouring slit: 0.5 mm, temperature of the coating composition 24.4° C., viscosity 300 m Pas, rate of transport 90 m/min., drying 30 min. at 80° C., irradiation 2×5000 W/60 sec., and development with cyclohexanone at 22°-24° C. in two chambers for 60 sec in each case.

Having regard to the requirements for enhanced environmental safety, the following formulation can be recommended particularly:

EXAMPLE 7

5000 parts of a 50% by weight solution of the photosensitive epoxide resin according to Example 1 (molecular weight 3171, epoxide content 0.97 equivalents/kg, viscositiy at 25° C.=7540 m Pas), in a mixture of low toxicity solvents, i.e. propyleneglycol monomethyl ether/glycolic acid n-butyl ester (80:20) are admixed portionwise with 2400 parts of a hardener composition containing micronised talcum. The mixture is stirred for 5 to 10 minutes and then diluted with 1500 parts of a 70:30 mixture of propyleneglycol monomethyl ether/diethyleneglycol dimethyl ether. This coating composition of low odour and low toxicity has a viscosity of 300 m Pas at 24° C. and a solids content of 41% by weight. On applying this material by the curtain coating method described above there is obtained a very uniform faultless coating on printed circuits with a superior edge covering on conductor lines and no plugging of plated through-holes.

The hardener composition containing micronised talcum is prepared as follows: 135 parts of a polyester resin containing hydroxyl groups (DYNAPOL LH 812, manufactured and sold by Dyanmit Nobel AG) are dissolved in a closed vessel in 932.3 parts of propyleneglycol monomethyl ether and 310.7 parts of tetrahydrofurfuryl alcohol at 70°–80° C. To this warm resin solution 50.5 parts of dicyandiamide and 10 parts of chlorotolurone are added portionwise and stirred until dissolved. Then 10 parts of the pigment Orasol Blue 2 GLN, 7.5 parts of the wetting agent Triton CF 10 (octylphenolbenzyl ether condensed with ethylene oxide), 42.5 parts of γ-glycidyloxypropyltrimethoxysilane are also dissolved by stirring. Finally, 881.5 parts of micronised talcum (mean particle size 1.5 μm) and 20 parts of bentone 27 (antisettling agent) are stirred in portionwise. This filler suspension is then dispersed in a Dyno mill (see Example 1) during 24 hours until the proper grinding fineness is achieved.

The improvement in the edge covering, obtained by the use of filler pastes, is measured, under the microscope, on polished specimen of conductor lines embedded in epoxide resin, and the results are summarised in Table 1. From this can clearly be seen the tendency, with the use of coating compositions modified with fillers, towards more uniform layer-thickness distribution over the centre and edges of the conductor lines. In particular, however, the layer thickness at the edges is very much greater than it is in the case of unfilled coating compositions.

It has also been shown that these formulations filled with micronised talcum withstand a threefold cycle of 10 sec./270° C. in the soldering bath, whereas unfilled coating compositions withstand this stress in most cases only once. In another test with more corrosive fluxes, the reject rate can be reduced from 30% to 0%. The quality of adhesion on lead/tin, measured according to DIN 53151, is raised from Gt 4 to Gt 0.

TABLE 1

| Layer-thickness distribution over conductor lines | | | | | | | | | | |
|---|---|---|---|---|---|---|---|---|---|---|
| Conductor height in μm | 70 | | 55 | | 70 | | 70 | | 70 | |
| Filler | Micronised talcum (1.5 μm) | | Micronised talcum (1.5 μm) | | Micronised talcum/Al$_2$O$_3$ (0.02 μm) (3:1) | | Micronised talcum/Al$_2$O$_3$ (1:1) | | (Comparison) | |
| layer thickness distribution* | centre | left right / edge | centre | left right / edge | centre | left right / edge | centre | left right / edge | centre | left right / edge |
| width of conductor in μm | | | | | | | | | | |
| 60 | 54 | 24/32 | 40 | 23/26 | 42 | 33/11.5 | 36 | 20/30 | | |
| 140 | | | | | | | | | 60 | 16/7 |
| 200 | | | | | | | | | 35–90 | 8/5 |
| 240 | 68.5 | 32/39 | 56 | 29/31 | 51 | 25/28 | 45 | 20/21 | | |
| 400 | | | 56 | 31/33 | | | | | | |
| 600 | | | | | | | | | 70 | 17/27 |
| 700 | 66 | 32/32 | 71 | 38/35 | 57 | 38/31 | 64 | 34/39 | | |

*Film thickness in %, relative to the laminate film thickness as 100%

What we claim is:

1. A curtain coating composition yielding uniform coatings with good edge covering having a viscosity of 200 to 700 m Pas at 25° C. and comprising a solution of a photosensitive, lacquer-forming substance, wherein the photosensitive substance is a photosensitive epoxide resin having free curable epoxide groups, admixed with a curing agent or admixed with a curing agent and a curing accelerator, which is further characterised in that there are uniformly dispersed in the solution from 5 to 50% by weight, relative to the photosensitive substance, of a finely divided filler, and that the photosensitive substance is additionally thermally curable.

2. A composition according to claim 1, which has a viscosity of between 200 and 500 m Pas.

3. A composition according to claim 1, wherein the photosensitive substance is a photosensitive epoxide resin having chalcone groups and free curable epoxide groups.

4. A composition according to claim 1, wherein the photosensitive substance is an epoxide resin obtained from bis-1,3(4-glycidyloxybenzal)acetone, 2,2-bis(4-hydroxyphenyl)propane and 2,2-bis(3,5-dibromo-4-hydroxyphenyl)propane.

5. A composition according to claim 1, which contains an organic solvent.

6. A composition according to claim 5, wherein the organic solvent is selected from the group consisting of alcohols, cyclic ketones, monoalkylated glycols, ethers and carboxylic acid esters, and mixtures of such solvents.

7. A composition according to claim 5, wherein the organic solvent is selected from the group consisting of tetrahydrofurfuryl alcohol, cyclohexanone, methyl glycol, propyleneglycol monomethyl ether, diethylene glycol dimethyl ether, ethyl glycol mono- and diacetate and glycolic acid n-butyl ester, and mixtures of such solvents.

8. A composition according to claim 1, which contains at least 10% by weight of the filler.

9. A composition according to claim 1, which contains from 10 to 36% by weight of the filler.

10. A composition according to claim 1, which contains from 15 to 30% by weight of the filler.

11. A composition according to claim 1, wherein the filler has a mean particle size of from 0.01 to 10 μm.

12. A composition according to claim 1, which contains as filler a micronised filler having a mean particle size of from 0.01 to 1.5 μm.

13. A composition according to claim 1, which contains a filler selected from the group consisting of: finely divided silicon dioxide, micronised talcum, micronised mica, kaolin, aluminium oxide, aluminium hydroxide, calcium silicate, aluminium silicate, magnesium carbonate, calcium carbonate, zirconium silicate, porcelain powder, glass powder, antimony trioxide, titanium dioxide, barium titanate and barium sulfate, and mixtures thereof.

14. A composition according to claim 1, which contains a filler selected from the group consisting of: finely divided silicon dioxide, micronised talcum, aluminium oxide, antimony oxide and kaolin, and mixtures thereof.

15. A composition according to claim 1, which contains at least 10% by weight of micronised talcum, either alone or in admixture with further finely divided fillers.

16. A process for producing protective masks by applying a thin layer of a coating composition as defined in claim 1 to a printed circuit board by the curtain coating method, subsequently drying and irradiating the layer image-wise while the soldered junctions are being left blank, developing the non-irradiated areas of the layer with a solvent and then curing.

* * * * *